United States Patent [19]

Iwakura et al.

[11] Patent Number: 5,600,568

[45] Date of Patent: Feb. 4, 1997

[54] ANALYSIS SYSTEM FOR THE DELAY TIME IN LOGIC EQUIPMENT

[75] Inventors: Yoshiyuki Iwakura, Yokohama; Atsushi Kimura, Kawasaki, both of Japan

[73] Assignee: Fujitsu Limited, Kawasaki, Japan

[21] Appl. No.: 277,742

[22] Filed: Jul. 20, 1994

[30] Foreign Application Priority Data

Oct. 18, 1993 [JP] Japan .................................. 5-259805

[51] Int. Cl.⁶ .................................................. G06F 17/50
[52] U.S. Cl. ............................................ 364/489; 364/488
[58] Field of Search ................................. 364/488, 489, 364/490, 491, 578, 900; 371/22.4

[56] References Cited

U.S. PATENT DOCUMENTS

| | | | |
|---|---|---|---|
| 4,517,661 | 5/1985 | Graf et al. | 364/900 |
| 4,698,760 | 10/1987 | Lembach et al. | 364/490 |
| 4,924,430 | 5/1990 | Zasio et al. | 364/578 |
| 5,003,487 | 5/1991 | Drumm et al. | 364/489 |
| 5,095,454 | 5/1992 | Huang | 364/578 |
| 5,168,455 | 12/1992 | Hooper | 364/490 |
| 5,191,541 | 3/1993 | Landman et al. | 364/489 |
| 5,210,700 | 5/1993 | Tom | 364/489 |
| 5,218,551 | 6/1993 | Agrawal et al. | 364/491 |
| 5,274,568 | 12/1993 | Blinne et al. | 364/489 |
| 5,359,535 | 10/1994 | Djaja et al. | 364/489 |
| 5,365,463 | 11/1994 | Donath et al. | 364/578 |
| 5,400,270 | 3/1995 | Fukui et al. | 364/578 |
| 5,422,891 | 6/1995 | Bushnell et al. | 371/22.4 |
| 5,452,228 | 9/1995 | Arakawa et al. | 364/489 |
| 5,457,638 | 10/1995 | Ashar et al. | 364/490 |

*Primary Examiner*—Kevin J. Teska
*Assistant Examiner*—Russell W. Frejd
*Attorney, Agent, or Firm*—Staas & Halsey

[57] ABSTRACT

The logic equipment delay time analysis system provides not only a number of parallel dedicated delay time processors which perform calculation of the delay time, but also a processor-to-processor communications device which is connected to each of the delay time processors and performs communications between these delay time processors. The circuit model of the logic equipment is divided by a circuit model division section into a number of small logic circuits, Data with regard to each of the divided circuit models is assigned to the individual delay time processors and initial values are set into each of the delay time processors, so that the delay times for all paths from each pin at which a signal is input to circuits at which output signals are generated are calculated.

16 Claims, 9 Drawing Sheets

ANALYSIS SYSTEM FOR THE DELAY TIME IN LOGIC EQUIPMENT

BACKGROUND OF THE INVENTION

1. Field of the Invention

The present invention is related to an analysis system, or apparatus, and more specifically it relates to a system that analyzes the delay time in logic equipment.

In recent years, advancements in VLSI technology have enabled the manufacture of sophisticated logic equipment with high performance. However, in the development of such equipment, it is necessary to verify the speed performance of the equipment before manufacturing the equipment. Delay time analysis systems are used as tools to verify the performance of logic equipment at the design stage. However, with the appearance of complex, large-scale systems, huge amounts of calculations are required for analysis of delay times, resulting in a great increase in the amount of time required for analysis.

2. Description of the Related Art

In the past, as a means of checking the target performance of a piece of logic equipment, the maximum and minimum accumulated delay times between each flip-flop circuit of the equipment using the target cycle time, adding to these values the clock skew (the time skew between the clock signal at the sending flip-flop circuit and the clock signal at the receiving flip-flop circuit), a verification being performed for over-delay and racing. The over-delay check is a check of whether or not the minimum accumulated delay time between flip-flop circuits, even taking into consideration the clock skew, falls within the clock cycle of the equipment. The racing check is a check of whether or not the minimum accumulated delay time between flip-flop circuits, even taking into consideration the clock skew, is within the width of a clock pulse.

The following three previously known methods are used in calculating the accumulated delay time between flip-flop circuits and the clock skew. The all-pin event method is the method of performing a calculation of the accumulated delay time from a specified clock input pin, and further calculating the accumulated signal delay time required from the clock pins that each clock reaches and from the primary input pins. Should there be a gate circuit at which two signals merge together at a flip-flop circuit input pin, in the calculation of that delay time only the maximum (over-delay) and minimum (racing) accumulated delay times required to reach the above-noted input pin are propagated onward, the accumulated delay time of other paths not being propagated onward from this point.

The separate-clock even method is a method that considers the differences in clock systems, wherein a calculation of the accumulated delay time for each specified clock is performed separately. Therefore, even at the above-noted merging-point gate, if the specified clock for each path differs, the calculation will be performed corresponding to each path. However, in this case as well in the case in which each path input to the above-noted merging-point gate circuit uses the specified clock, only the path having the maximum or the minimum delay value is calculated, as in the all-pin event method described above.

The all-path trace method is the method in which the accumulated delay time for all paths to be calculated is calculated. Therefore, all the paths up to the desired flip-flop circuit are calculated.

However, each of the above-described methods presents the following problems.

In the above-described all-pin event method, because this is a method which uses either the minimum or the maximum delay value to represent the delay value in the case in which paths reconverge, in the case in which paths reconverge from flip-flop circuits which are driven by different clocks, the maximum or minimum delay value is determined without being able to consider the correct clock skew. For this reason, the problem of not being able to calculate the accumulated delay time accurately occurs.

In the above-described separate-clock even method, because delay values are calculated for each flip-flop circuit driven by the same clock, while the clock skew can be calculated accurately, even in the case of the same clock, because it is only possible to calculate the maximum or minimum accumulated delay time to reach the destination flip-flop circuit, it is not possible to determine the accumulated delay time of a bad path in relation to a different clock at the next path. This is a problem that is common to the above-described all-pin event method as well.

Further, in the above-described all-path trace method, because the worst path is determined by calculating the delay times for all the existing paths, the problem of requiring a huge amount of calculations and computer time exists. Therefore, in performing verifications on an actual piece of equipment, it is not possible to calculate all paths in a limited amount of time.

Two problems are held in common by the above-described methods. These are a first problem that the dispersion calculation by mean square method cannot be properly made due to the fact that it is not possible to recognize whether or not paths having the maximum or minimum accumulated delay time pass through one and the same LSI device, and a second problem of the difficulty in recognizing branch points in the clock system paths, making clock skew calculation impossible. The mean square method of calculating the dispersion is a statistical processing method of calculating an accumulated delay time that is the closest possible to an actual piece of equipment, this method being applied because of the variations in delay times introduced in the manufacturing process for LSI and other devices.

SUMMARY OF THE INVENTION

The object of the present invention, in consideration of the above problems, has as its object the provision of a delay time analysis system which shortens the calculation time required by and improves the accuracy of, the calculation of the delay time.

By means of the present invention, a delay time analysis system is provided which has a circuit model division section which divides the logical model of the logic equipment into small logic circuits, a plurality of delay time calculation processors which are provided in parallel for the sole purpose of calculating the delay time, and a processor-to-processor communications section which is connected to each of the above-described delay time calculation processors and performs communications between the delay time calculation processors, wherein data with regard to each of the above-described divided circuit models is assigned to the plurality of delay time calculation processors, with initialization conditions being set at each of the delay time calculation processors, the accumulated delay time from each pin of the logic equipment at which an input signal is applied until the output signal is generated being calculated for all paths.

The above-described delay time calculation processors, for each of the assigned circuit models, calculate the delay time from each of the input points (pins) of each circuit within the above-noted circuit model to the output point for each path by setting an event in sequence at each of the pins corresponding to each path. The above-noted calculations are performed in parallel by the above-noted plurality of delay time calculation processors.

Further, the above-noted delay time calculation processors, in calculating the delay time from one pin to the next pin for each path, generate a passage pin table which represents the sequence of pins passed for each of the paths.

In addition, in the case in which it is judged that the next pin does not exist within one and the same assigned circuit model of the above-noted delay time calculation processors, the generation of an event at the next pin and the above-described passage pin table are transferred to the above-noted processor-to-processor communications section, this processor-to-processor communications section then transferring the above-noted data to the delay time calculation processor to which the circuit model having the next pin is assigned.

The above-described logic equipment delay time analysis system also has an analysis section which performs a check of the accumulated delay times determined for each path for each of the above-described divided circuit models, and in performing over-delay and racing checks between flip-flop circuits, this analysis section uses the passage pin table generated for each of the above-described paths to recognize clock system branch points and calculate the clock skew. In performing a timing check of the input signals to a memory device, the above-described analysis section uses the passage pin table to determine whether or not a number of related paths pass through one and the same LSI device and calculate the accumulated delay time required for arrival of the signals.

BRIEF DESCRIPTION OF THE DRAWINGS

The present invention will be more clearly understood from the description set forth below, with reference being made to the accompanying drawings.

DESCRIPTION OF THE PREFERRED EMBODIMENTS

Figure 1:
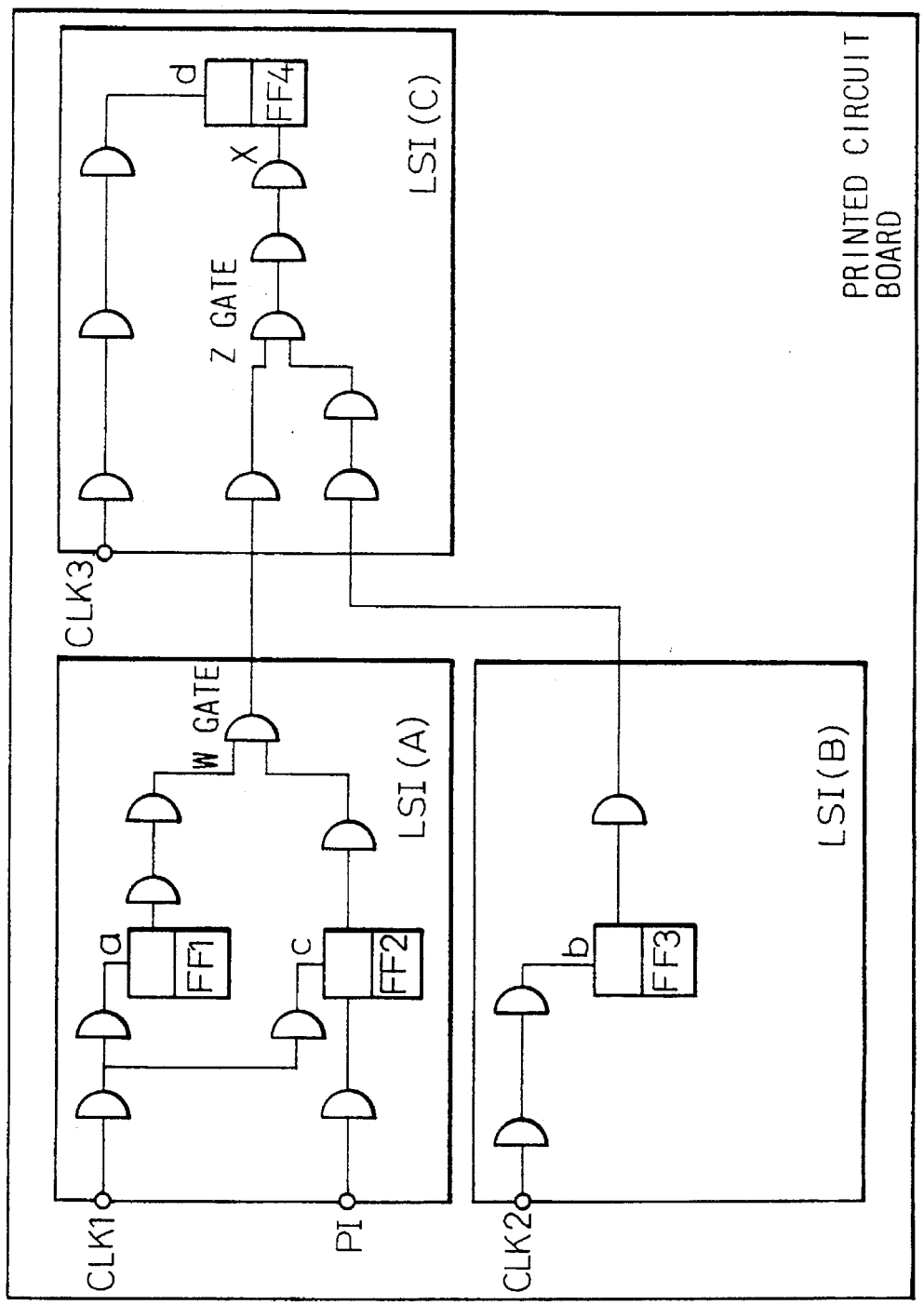
FIG. 1 is a circuit diagram of an example of a logic circuit.
Figure 2:
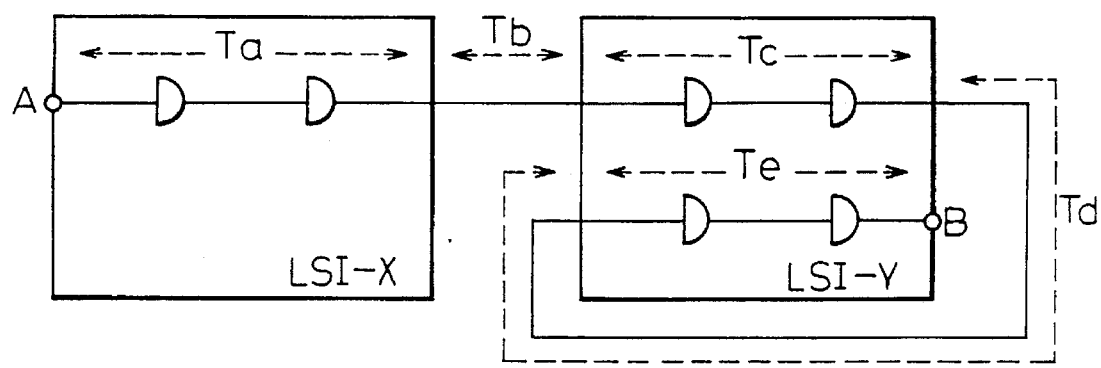
FIG. 2 is an example of a paths through one and the same LSI device.

Before describing the preferred embodiments according to the present invention, examples of the related art are provided, with reference being made to accompanying drawings FIG. 1 and FIG. 2.

FIG. 1 is a logic diagram which will be used to describe the above-described three methods of calculating the accumulated delay time between flip-flop circuits and the clock skew.

FIG. 2 is an example of paths through one and the same LSI device.

Using FIG. 1 to explain the above-noted all-pin event method, events are set at the specified clock pins (CLK1, CLK2, and CLK3) and the calculation of the accumulated delay times is started. Calculation is made of the accumulated delay time from the clock pins of the flip-flop circuits at which each clock arrives (a, b, c, and d) and from the primary input pins (indicated as PI). For example, in calculation of the delay time up until the point X on the input side of flip-flop circuit 4, in which there are two signals merging as they do at gate circuit Z, the maximum (over-delay) or minimum (racing) accumulated delay time is propagated onward. Should the delay value from point a be the maximum or the minimum, the accumulated delay time of the path from point b stops at that point and is not propagated onward.

In the separate-clock even method, of the clock input pins shown in FIG. 1, first a calculation is made of the accumulated delay time from clock CLK1, and then a further calculation is made of the accumulated delay time from the clock pins (a and c) of the flip-flop circuits which this clock reaches and from the primary input pin (PI). Next, a calculation is made of the accumulated delay time from clock CLK2, with processing proceeding in sequence from the specified clock input pins. Therefore, in calculating the delay time up to the point X, separate calculations are made for the path a and the path b with respect to gate circuit Z. However, with regard to gate circuit which uses the same CLK1, in the same manner as in the above-described all-pin event method, of the path from point a and the path from point c, the calculation is only made of the path having the maximum or minimum delay time.

In the all-path trace method, in the case of FIG. 1, the accumulated delay times are calculated for all paths as is, these being with regard to clock CLK1, the CLK1 →a→Z→X path and the CLK1 →c→Z→X path, and with regard to CLK2, the CLK2 →b→Z→X path. Therefore, there are a total of three calculations performed with regard to the paths from the gate circuit Z to the flip-flop circuit 4.

However, the above methods, as described in the section on related art, have various problems.

FIG. 2 explains how it is not possible to properly calculate the dispersion using the mean square method, a problem held in common by the above-described methods.

In FIG. 2, two LSI devices, LSI-X and LSI-Y are connected, there being within one and the same LSI-Y the paths Tc and Te. In this case, the maximum accumulated delay time from point A to point B is properly given by the following equation.

$$Tpd(\max) = Ta + Tb + Tc + Td + Te + \sqrt{\Delta Ta^2 + (\Delta Tc + \Delta Te)^2} \qquad (1)$$

In the above, Ta to Te are the typical values of delay in each of the sections, and $\Delta Ta$, $\Delta Tc$, and $\Delta Te$ are the dispersions in delay value caused by variations in the LSI device.

With respect to this, if it is not possible to recognize that the path Tc and the path Te are in one and the same LSI device (i.e., device LSI-Y), the above equation becomes the following erroneous equation.

$$Tpd(\text{max}) = Ta + Tb + Tc + Td + Te + \sqrt{\Delta Ta^2 + \Delta Tc^2 + \Delta Te^2} \quad (2)$$

Therefore, between the cases in which it is and is not possible to recognize that the paths are through one and the same LSI device, an error arises in the calculation of the terms ΔTc and ΔTe in Equation (1) and Equation (2). That is, the maximum accumulated delay time according to Equation (2) is smaller than that of Equation (1) by the amount 2ΔTcΔTe.

The present invention is for the purpose of solving the various above-described problems, and what follows is a detailed description of the delay time analysis system for logic equipment according to the present invention.

Figure 3:
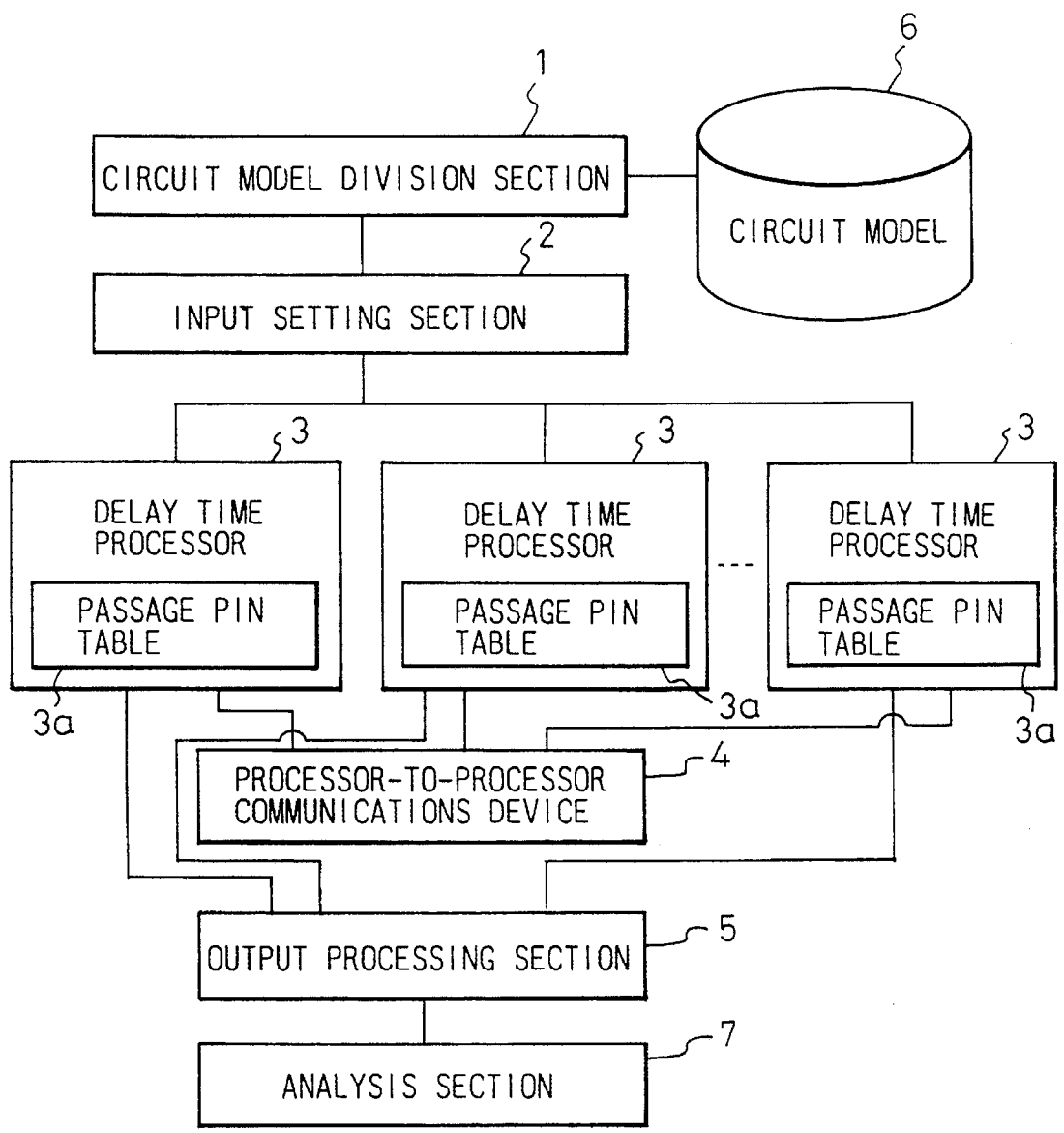
FIG. 3 is a drawing of the concept of the present invention.

FIG. 3 shows the conceptual configuration of the present invention.

In this figure, 1 is a circuit model division section, 2 is an input setting section, 3 are a plurality of delay time calculation processors used exclusively for the calculation of delay times with regard to the divided circuit models, 4 is a processor-to-processor communications section, 5 is an output processing section, 6 is a circuit model (data) with regard to which the delay time analysis is to be performed, and 7 is an analysis section which checks the accumulated delay time.

In the present invention, although the all-path trace method is used to calculate the accumulated delay time of all existing paths, in order to perform this huge amount of calculations in a short period of time, a plurality of dedicated delay time calculation processors is provided, the circuit model being divided into plural divided circuit models assigned to the delay time calculation processors, the accumulated delay times for each path in each circuit model being calculated by parallel processing, and the thus determined accumulated delay times being used for analysis.

The circuit model division section 1 divides the circuit model 6 into the optimum blocks (one block is taken as a collection of circuitry having a given relationship). The data for the circuit models of the divided circuits are set by the input setting section 2 at each of the delay time calculation processors 3. A program for calculating the delay time is set into each of the delay time calculation processors 3 beforehand. The divided circuit models (blocks) are connected to one another by pins which output signals to other blocks and pins which input signals from other blocks, these pins being known as passage pins.

Each of the delay time calculation processors 3 performs a calculation of the delay time for each of the paths that makes a connection from each start circuit (e.g., pin or flip-flop circuit) to each of the block output points (input points to a subsequent block). In doing this, with regard to a plurality of paths that are not mutually interrelated, a plurality of delay time calculation processors 3 are used to process the calculations in parallel, and to set event flags at the processed pins. When the calculation for a given pin is completed, the event flag at the next pin is set.

When an event is set at a pin which belongs to a model assigned to a different delay time calculation processor 3, this is transferred to the processor-to-processor communications section 4, which sets it at another delay time calculation processor 3. When a pin having an event flag occurs, the delay time calculation processor 3 sequentially executes calculation of the delay times of the paths from that pin. In this manner, processing is performed for pins in the sequence that flags are set at those pins, calculation being performed of the accumulated delay time of all paths up to the destination input pin of the flip-flop circuit. Therefore, the more improvement there is in efficiency by means of parallel processing, the shorter will be the calculation time.

The passage pin table 3a, at which is sequentially stored the pins which are passed during the calculation processing, is generated at each of the delay time calculation processors 3 which process the block at the signal destination (front end of the path), data of each passage pin on the path within the same block being set, and when the path is connected to the next block, this passage pin table 3a is passed via the processor-to-processor communications section 4 to the delay time calculation processor 3 which processes the next block. Thus, as the passage pin table is sequentially passed in this manner, passage pin data is added to it for each path, enabling recognition of the route taken, by path, to a destination flip-flop circuit. By doing this, the problems of recognizing a path in one and the same LSI device and of recognizing a clock system branch point are solved.

The results of calculations are output from each of the delay time calculation processors 3 to the output processing section 5, and the analysis section 7 performs an over-delay check and a racing check of the accumulated delay times of each path.

Figure 4:
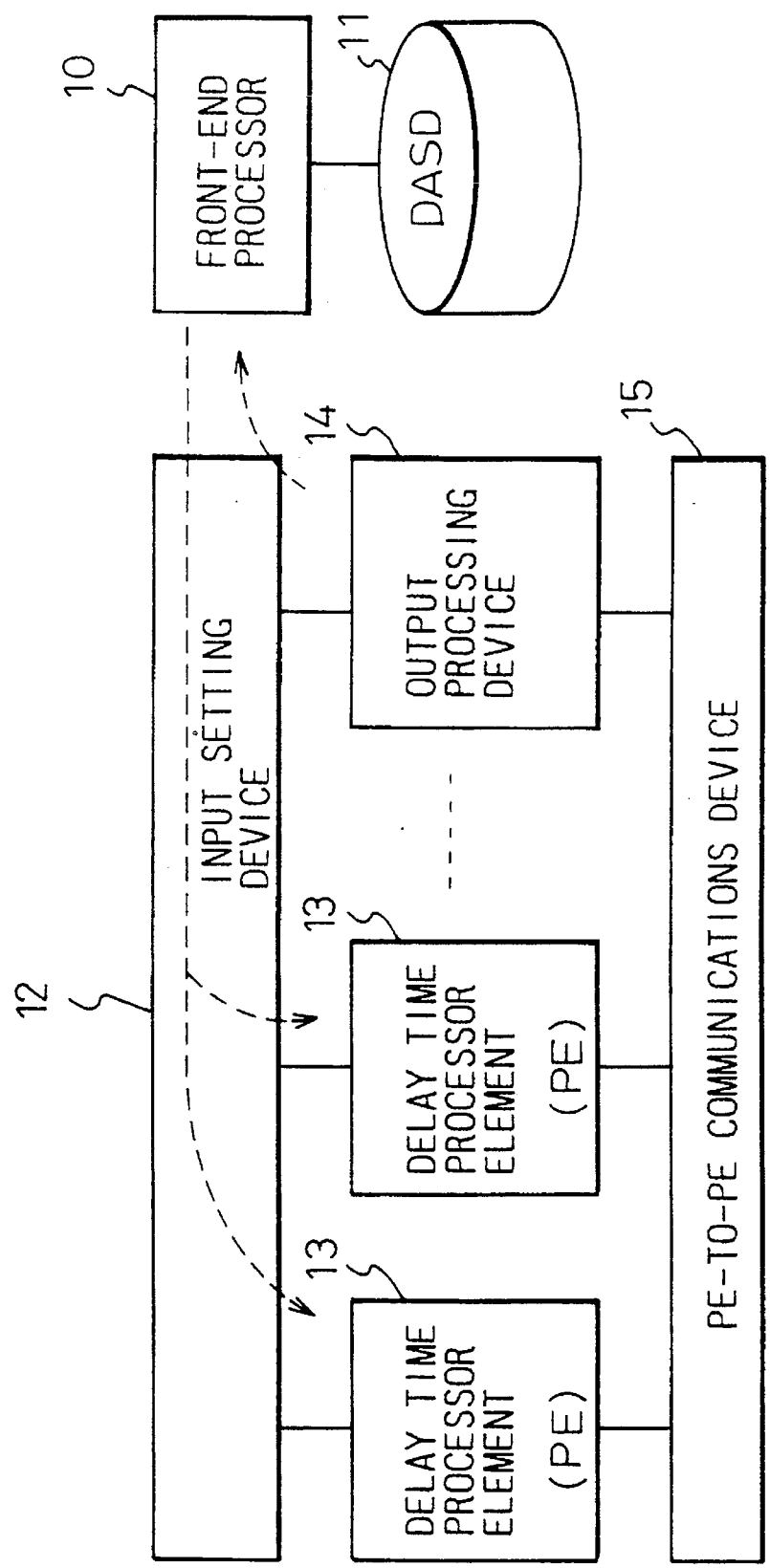
FIG. 4 is a system block diagram of one embodiment of the present invention.

FIG. 4 shows the system block diagram of an embodiment of a logic equipment delay time analysis system according to the present invention. In FIG. 4, 10 is a front-end processor, 11 is a DASD into which is stored a design database (corresponding to 6 in FIG. 3), 12 is an input setting device (corresponding to 2 in FIG. 3), 13 are a plurality of hardware delay time processor elements (PEs) dedicated to calculating the delay times, 14 is an output processing device (corresponding to 5 in FIG. 3), and 15 is a PE-to-PE communications device which is a device that performs communications between delay time processing elements (corresponding to 4 is FIG. 3). The above-noted input setting device 12 performs initial settings of the circuit models assigned to each of the plurality of delay time processor elements and start event settings.

Figure 5:
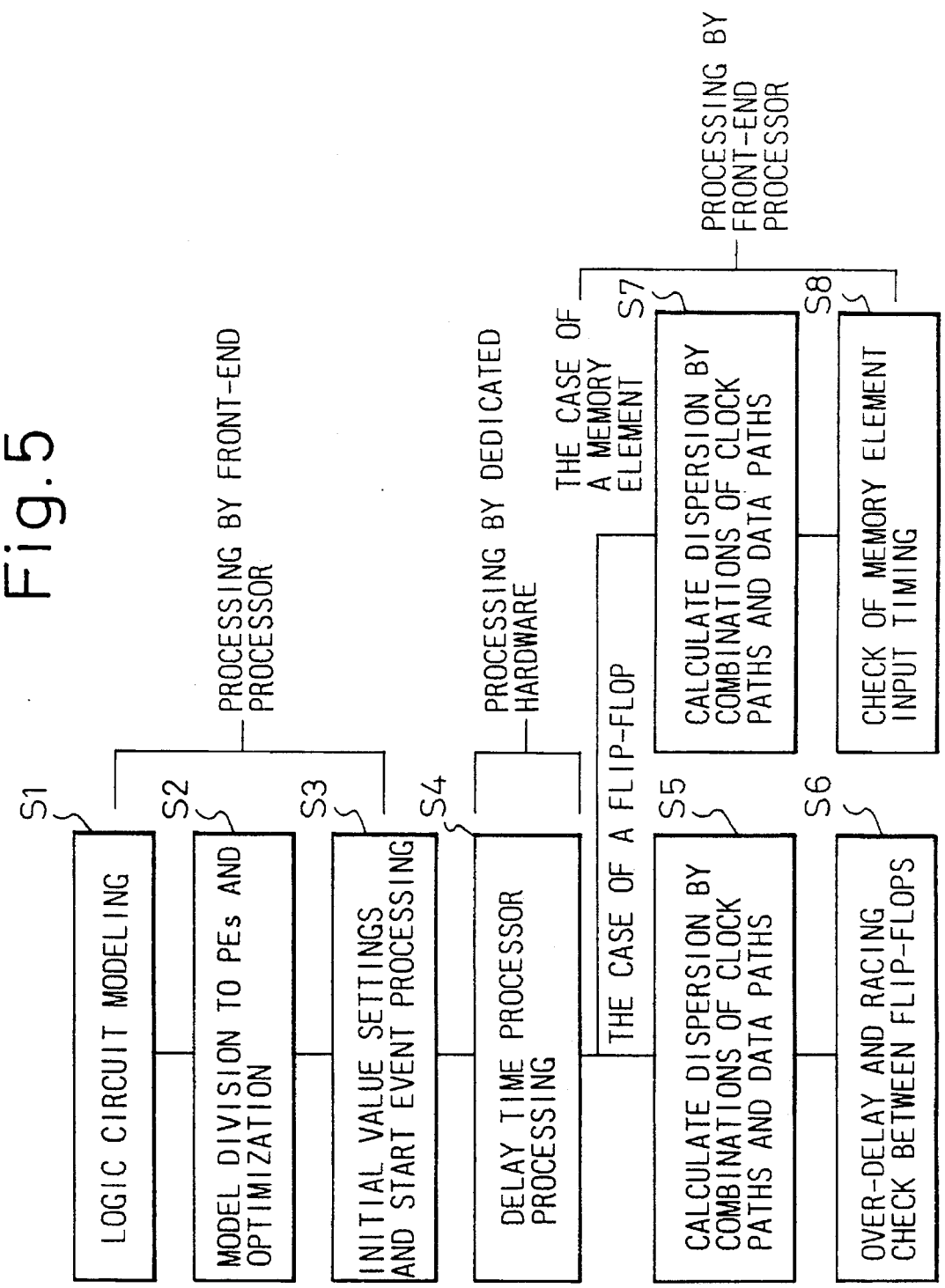
FIG. 5 is the flowchart showing an example of the operation of the system of FIG. 4.

FIG. 5 is a flowchart which shows an example of the operational flow of the system of FIG. 4.

First, in the front-end processor 10, the logic circuit model is generated. In this case, the logic circuit model is extracted from the DASD 11 into which was stored the design database, this along with the sectional delay values of the circuit being used to generate a circuit model that can be stored in the delay time calculation processors 13 (S1 in FIG. 5). Next, the thus generated logic circuit model is optimally divided at the front-end processor 10 for assignment to each of the delay time processor elements, and the models are stored into each of the delay time processor elements 13.

The logic circuit model division criterion is the achievement of a reduction in the amount of communications between the circuits assigned to each of the delay time processor elements 13. For example, after assignment of a sequence to each of the circuits using, for example, the level sorting method, it is possible to use a method of assignment by either physical level or logic circuit designer design units.

Next, the primary pin initial value settings (starting events) and initial value settings of specified clock pins are made from the input setting device 12 with respect to each of the delay time processor elements 13 (S3 in FIG. 5). After that, processing of the calculation of the accumulated delay times is performed at each of the delay time processor elements 13, in accordance with the starting pins.

What follows is a description of the processing of the delay time calculation, with reference made to the configuration shown in FIG. 4.

The accumulated delay time from each of the pins at which an event is set to the next pins is performed by each of the delay time processor elements 13, and the event is set at the next pins. If the event is set at a pin which belongs to a model that is assigned to a different delay time processor element, that event and the passage pin table are transferred to the PE-to-PE communications device 15. The PE-to-PE communications device 15 is linked to each of the delay time processor elements 13, and performs processing of the transfer of the event data and passage pin table transferred from the delay time processor element 13. The output processing device 14 stores the passage pin table at the flip-flop circuit that is reached and the accumulated delay times of each pin, and after processing performs processing of the output of that data to the DASD 11 of the front-end processor 10.

In this manner, the accumulated delay time is obtained in the DASD of the front-end processor 10, so that if in accordance with the next obtained data the next logic circuit to be processed is a flip-flop circuit, the front-end processor 10 can, based on the passage pin table, calculate the accumulated delay times of clock system paths and data paths correctly, while considering branch points and paths that are routed through one and the same LSI device (S5). Then, based on each of the calculated accumulated delay times, a comparison is performed to make an over-delay check and a racing check (S6).

In addition, if the logic circuit is a memory element, with regard to various signals such as read/write signals, address signals, data signals, and clock signals, the path to be processed is selected based on a comparison of the timing of input to the memory element, the dispersions of these being properly calculated by means of the passage pin table (S7 in FIG. 5). After that, based on the calculated accumulated delay time for each of the paths up until the memory element, an input timing comparison is made to perform a check (S8).

Figure 6:
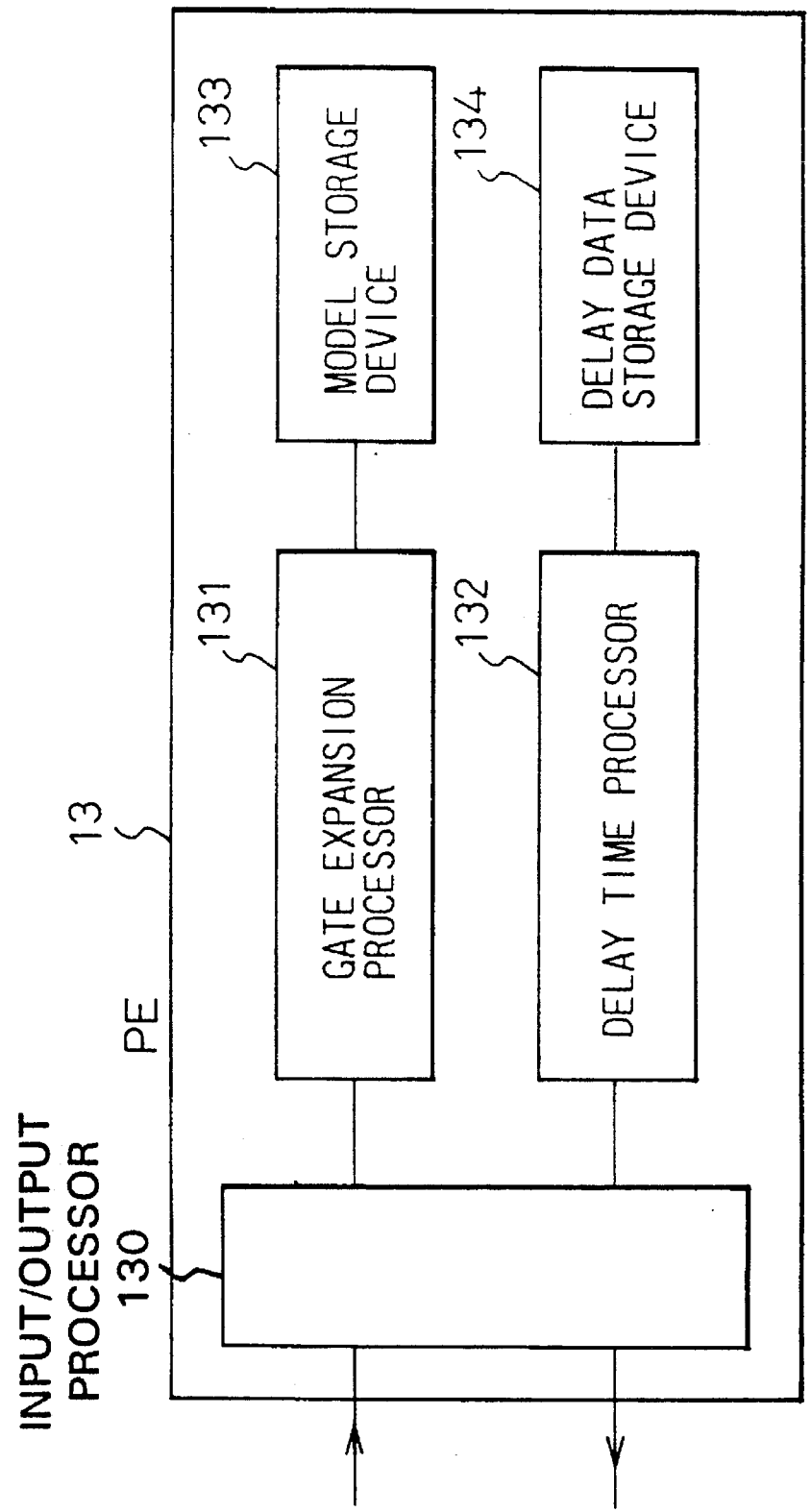
FIG. 6 is a block diagram showing an embodiment of a delay time calculation processor.
Figure 7:
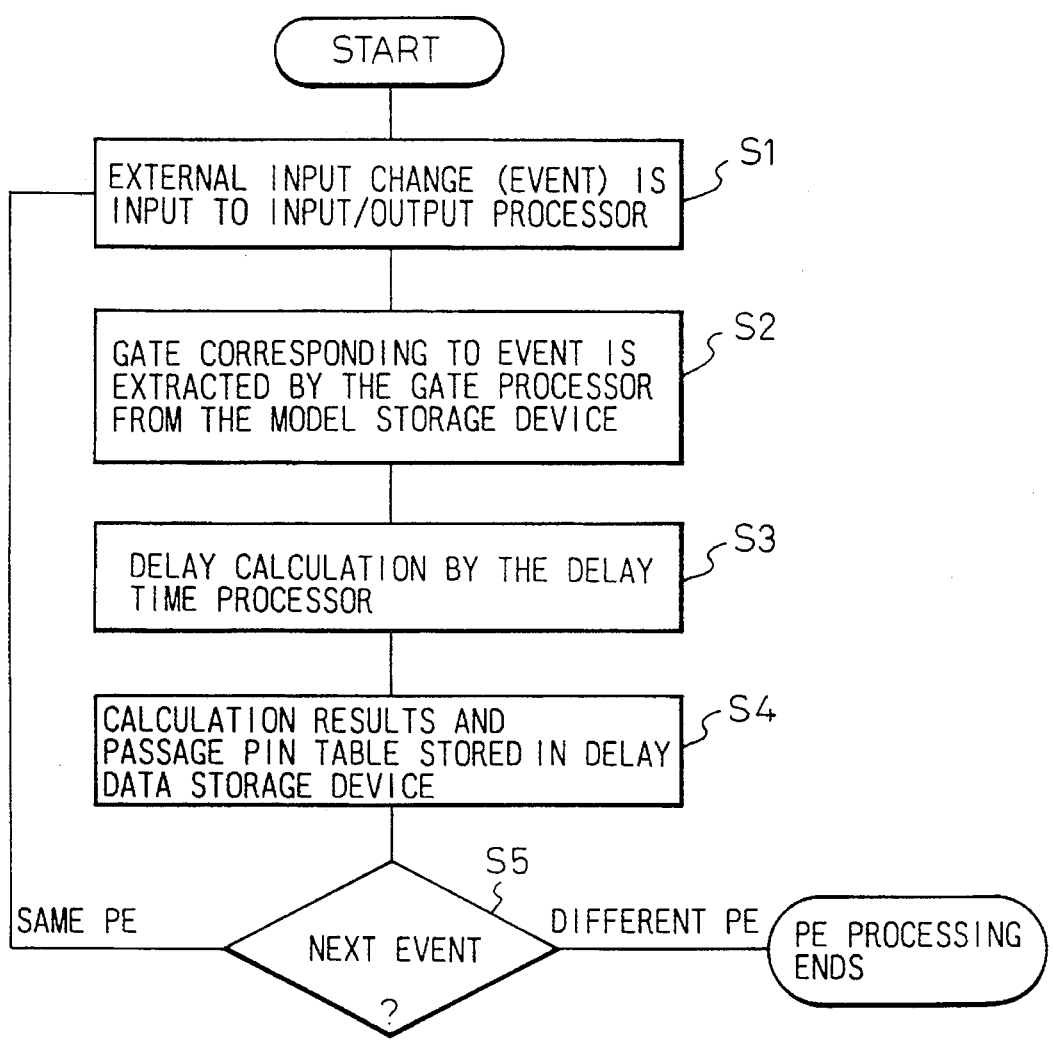
FIG. 7 is a flowchart showing an example of the processing flow in the delay time calculation processor of FIG. 6.

FIG. 6 is a block diagram which shows an embodiment of the delay time analysis system of FIG. 4, and FIG. 7 is a flowchart which shows the operational flow of the delay time analysis system of FIG. 6.

The delay time processor element 13 of this embodiment has the configuration as shown in FIG. 6, wherein 130 is an input/output processor which performs input and output processing of data between the input setting device 12, that is, the front-end processor 10 and the PE-to-PE communications device 15, 131 is a gate expansion processor, 132 is a delay time processor, 133 is a model storage device, and 134 is a delay data storage device.

In the model storage device 133 is stored the models for the divided logic circuits, and in the delay data storage device 134 is stored delay values and passage pin tables.

FIG. 7 is a flowchart which shows the operational flow of the delay time analysis system of FIG. 6.

When an event, which indicates a change in an external input, is input to the input/output processor 130 (S1 in FIG. 7), the gate expansion processor 131 extracts the gate circuit corresponding to the event from the model storage device 133 (S2). Then the delay value for the extracted gate circuit is calculated by the delay time processor 132 via the input/output processor 130 (S3). The results of that calculation and the passage pin are stored in the delay data storage device 134 (S). After that, a determination is made as to whether the next event is input (S5), and if the next event is recognized, processing continues at the delay time processor element (PE), but if an event is not input, notification of event and passage pin table is given via the PE-to-PE communications device (15 in FIG. 4) with respect to the other delay time processor elements and processing is finished.

Figure 8:
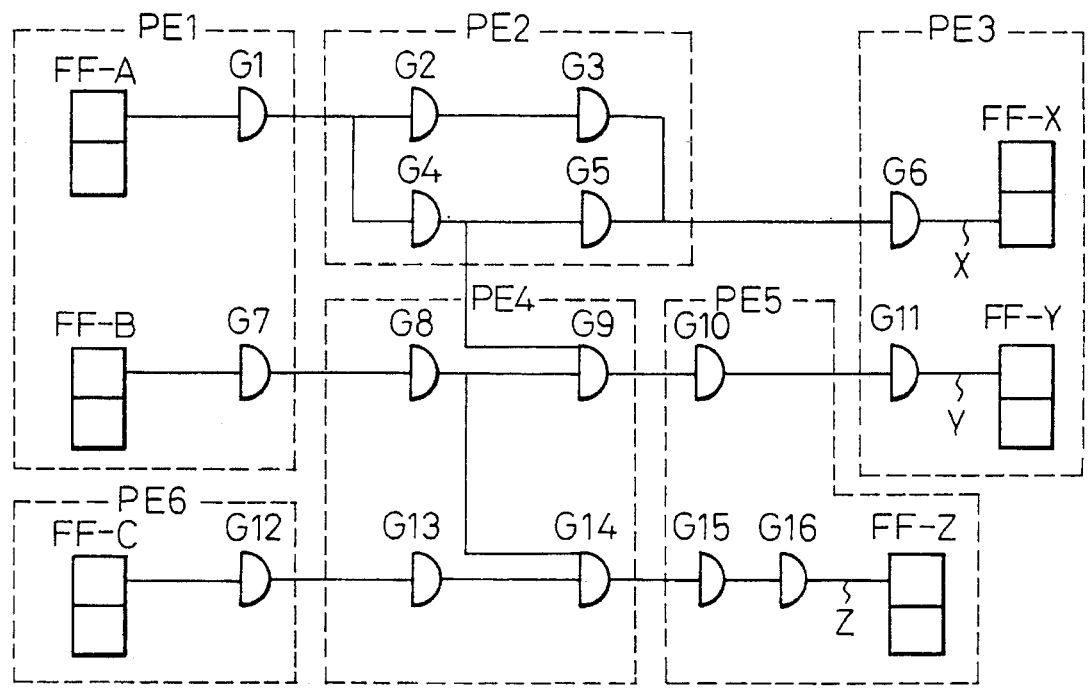
FIG. 8 shows an example of logic circuit assignments.

FIG. 8 shows the assignment of logic circuits. The logic circuits in FIG. 8 are optimally divided into the six circuits indicated by the dotted lines, these divided circuits being assigned to the six delay time processor elements (PE), that is, being assigned to PE1 to PE6, the delay times from flip-flop circuit A, B, and C being calculated in the example shown. In this case, because the path from flip-flop circuit A via gate circuit G1 which reaches gate circuits G2 and G4 is resident in a different delay time processor element than the path from flip-flop circuit C via gate circuit G12 to gate circuit G13, it is possible to perform simultaneous processing. Using the results of those calculations, in the same manner, simultaneously calculation is performed of the delay times for the path from flip-flop circuit B via gate circuit G7 to gate circuit G8, the path from gate circuit G2 to gate circuit G3, and the path from gate circuit G13 to gate circuit G14. In this manner, paths are sequentially processed from the pin at which the next flag is set, the accumulated delay times for data from the destination flip-flop circuit to the input pins X, Y, and Z being calculated for all paths.

In doing this, when calculating the accumulated delay time, the passage pin table in which is stored the sequence of passage pins is propagated, enabling recognition of the route by which the destination flip-flop circuit was reached. The passage pin table of FIG. 8 at flip-flop circuit Z is obtained in the following manner. That is, at the input pin of gate circuit G1 flip-flop circuit A is input, at the input pin of gate circuit G2 flip-flop circuit A and gate circuit G1 are propagated, at the input pin of gate circuit G3, flip-flop circuit A, gate circuit G1 and gate circuit G2 are propagated, and finally at the input pin of gate circuit G6, flip-flop circuit A and gate circuits G1, G2, and G3 are propagated. In this manner, at the destination flip-flop circuit X, there are two passage pin tables generated for the two paths from flip-flop circuit A to flip-flop circuit X, the passage pin table having the path consisting of flip-flop circuit A and gate circuits G1, G2, and G3, and the passage pin table having the path consisting of flip-flop circuit A and gates G1, G4, G5, and G6. Therefore, from these tables it is possible to properly calculate the dispersion time using the mean square method, even in the case in which a path is routed through a different LSI device and then re-enters the same LSI device again.

Figure 9:
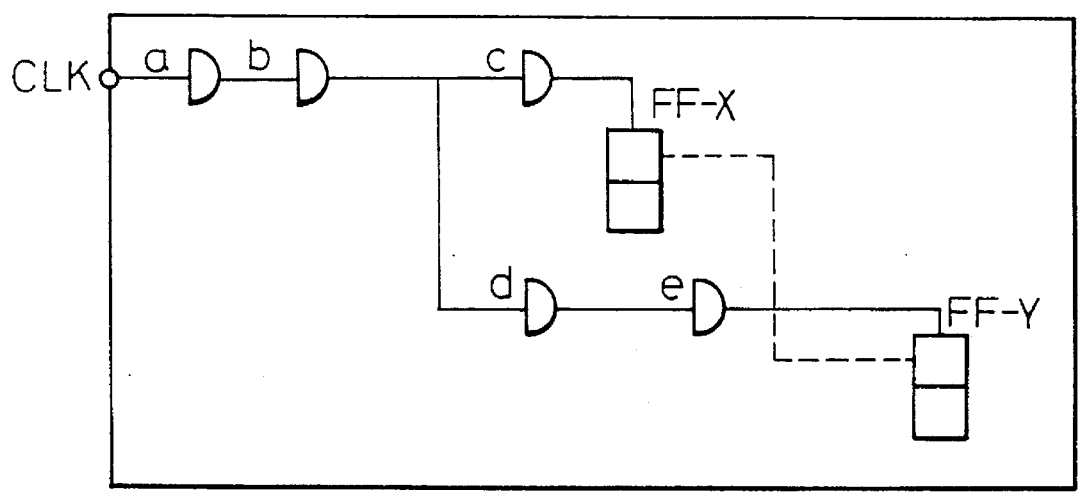
FIG. 9 is an explanatory drawing which shows an example of a clock system path passage pin table.

FIG. 9 is a drawing explaining an example of the passage pin table for a clock system path.

The logic circuit shown in FIG. 9 has the path from the clock input CLK to the flip-flop circuit X and the path from the clock input CLK to the flip-flop circuit Y. In this drawing, 70 is the passage pin table for the path leading to flip-flop circuit X, and 71 is the passage pin table for the path leading to flip-flop circuit Y. By comparing these two passage pin tables, it is possible to easily determine which portions of the paths are common and at what point the paths separate. For this reason, clock skew cause by branch points is properly calculated, and the accuracy of delay time calculation is improved. Specifically, in the case of a circuit between flip-flop circuits having a clock system as shown in FIG. 9, in making the over-delay check, in calculating the delay of the path from the clock (CLK) pin to the flip-flop circuit X, the delay value up to the common gate circuit b in the passage pin table is calculated as a typical value, with the delay value after the branch point and up to the flip-flop circuit X being calculated as the maximum value. The delay value from the flip-flop circuit X to the flip-flop circuit Y, shown by the dotted line in the drawing, is calculated as the maximum value, this data being taken as Tdata. The delay value for the path from the clock (CLK) pin to the flip-flop circuit Y is calculated as a typical value up to the common gate b, and is calculated as the minimum value after the branch point and up to the flip-flop circuit Y, this value being taken as Tclk2. These calculation results are substituted in the inequality relationship given below as a check. If the inequalities holds, the result is good. The t in the inequality is the clock cycle time.

$$Tdata-Tclk2<\tau$$

As described above, according to the present invention the following effects are achieved.

It is possible to shorten the amount of time required for calculation of the delay time. That is, high-speed processing using dedicated hardware is possible, the processing speed being dramatically improved (approximately 100 fold) in comparison with software processing. In addition, it is possible to achieve high-speed processing by using simultaneous processing. With regard to this, if 1 is the value when parallel processing is not used, the high-speed processing of a degree represented by the following expression is achievable, in accordance the number of delay time processor elements (PEs) used.

$$\propto \Sigma Path/p^{l-a}$$

(where ΣPath is the number of paths to be calculated, P is the number of processors (PEs), and a is a constant smaller than 1)

By being able to recognize the same LSI and clock branch points, an improvement is made in the accuracy of calculating the delay time.

We claim:

1. A logic equipment delay time analysis system, comprising:

a circuit model division section which divides a circuit model of a logic device into plural, divided circuit models, a plurality of delay time processors, respectively corresponding to the plurality of divided circuit models, which perform corresponding calculations, in parallel, of the respective delay time of the plural, divided circuit models; and a processor-to-processor communications device which is connected to, and performs communications between, said plurality of delay time processors, wherein:

data with regard to each divided circuit model, of the plurality of divided circuit models, is assigned to the corresponding delay time processor of said plurality of delay time processors, by said circuit model division section, and said processor-to-processor communications device receives the delay time, calculated by each delay time processor of the plurality of delay time processors, and transmits the received delay time to the other delay time processors of the plurality of delay time processors, thereby to calculate accumulated delay times from the input pins of the logic device to the output pins of the logic device.

2. A delay time analysis apparatus according to claim 1, wherein:

each divided circuit model of the plurality of divided circuit models has pins therein, said delay time processors operate in parallel to calculate the respective delay times for a plurality of paths from each input pin of the logic device to each output pin of the logic device by, for each divided circuit model of the plurality of divided circuit models, sequentially setting events from each pin of the respective divided circuit model through which a path of the plurality of paths is routed to the next pin.

3. A delay time analysis apparatus according to claim 2, wherein:

the circuit model comprises sequentially arranged pins between the input pins and the output pins, and in each delay time processor of the plurality of delay time processors, wherein calculating the delay time of each path of the plurality of paths from one pin of the circuit model to the next sequential pin of the circuit model, a passage pin table is generated which shows the sequence of passage through the pins of the corresponding divided circuit models for each path of the plurality of paths.

4. A delay time analysis apparatus according to claim 3, wherein:

each delay time processor of said plurality of delay time processors, in the case in which the next pin of the circuit model does not exist in the corresponding divided circuit model assigned thereto, transmits a next pin event generation and the generated passage pin table to said processor-to-processor communications device; and said processor-to-processor communications device transmits the next pin event generation and the generated pin table to the delay time processor of the plurality of delay time processors having a corresponding divided circuit model which includes the next pin.

5. A delay time analysis apparatus according to claim 4, further comprising:

an input setting device which provides data for each divided circuit model of the plurality of divided circuits model; and each delay time processor of the plurality of delay time processors further comprises:

an input/output processor which performs input/output processing of data between said input setting device and said processor-to-processor communications devices, a model storage device which stores a model of the corresponding divided circuit model resulting from the data provided by said input setting devices, a delay data storage device which stores the delay time calculated by the respective delay time processor and the passage pin table of the respective delay time processor, a gate expansion processor which, when an event indicating a change in an external input is received, extracts from said model storage device a gate circuit corresponding to said events, and a delay time processor which calculates the delay time for the extracted gate, stores the calculated delay time and the passage pin table into said delay data storage device, and, when an event is not received, notifies said processor-to-processor communications device via said input/output processor of the event generation and the passage pin table.

6. A delay time analysis apparatus according to claim 3, wherein the logic device includes flip-flop circuits connected together, the apparatus further comprising:

an analysis section which
  checks the accumulated delay time with regard to each path after the delay time of each path is determined for each divided circuit of the plurality of divided circuit models, and
  performs an over-delay and racing check between flip-flop circuits of the logic device, and, when performing the over-delay and the racing check, uses the passage pin tables generated for each said path to distinguish clock path branch points and calculate clock skew.

7. A delay time analysis apparatus according to claim 6, wherein, in performing an input signal timing check, the passage pin tables are used to determine whether or not a plurality of paths is routed through one and the same LSI device and a calculation is made of the delay time until arrival.

8. A delay time analysis apparatus according to claim 7, wherein said analysis section performs a judgment as to whether a circuit in the logic device is a flip-flop circuit or a memory element, and uses a corresponding comparison relationship to calculate the clock skew.

9. A delay time analysis apparatus for analyzing a circuit model of a logic device having input pins at which signals are received and output pins at which signals are output, the delay time analysis apparatus comprising:
  a circuit model division section which divides the circuit model into a plurality of divided circuit models;
  a plurality of delay time processors, respectively corresponding to the plurality of divided circuit models, which perform corresponding calculations, in parallel, of the respective delay times of the plural, corresponding divided circuit models; and
  a processor-to-processor communications device which receives the corresponding delay times calculated by the plurality of delay time processors and transmits, to each of the delay time processors the corresponding delay times of the other delay time processors of the plurality of delay time processors, thereby for calculating delay times from the input pins of the logic device to the output pins of the logic device.

10. A delay time analysis apparatus according to claim 9, wherein:
  a plurality of paths are routed from the input pins to the output pins of the logic device;
  each divided circuit model of the plurality of divided circuit models has sequential pins therein; and
  each delay processor of the plurality of delay processors sequentially sets events from each pin to the next sequential pin of the corresponding divided circuit model through which a path of the plurality of paths of the logic device are routed, to calculate the delay time for the plurality of paths routed through the logic device.

11. A delay time analysis apparatus according to claim 10, wherein:
  the circuit model includes sequentially arranged pins between the input pins and the output pins, and
  in each delay time processor of the plurality of delay time processors, when calculating the delay time of each path of the plurality of paths routed through the logic device, a passage pin table is generated which shows the sequence of passage through the pins of the corresponding divided circuit model for each path of the plurality of paths routed through the logic device.

12. A delay time analysis apparatus according to claim 11, wherein:
  when the next pin of the circuit model does not exit in the corresponding divided circuit model of a delay time processor, the respective delay time processor produces a next pin event signal and transmits the next pin event signal and the generated passage pin table to the processor-to-processor communications device, and
  the processor-to-processor communications device transmits the next pin event signal and the pin table to the delay time processor of the plurality of delay time processors having a corresponding divided circuit model which includes the next pin.

13. A delay time analysis apparatus according to claim 12, further comprising:
  an input setting device which provides data for each divided circuit model of the plurality of divided circuit models, and
  each delay time processor of the plurality of delay time processors further comprises:
  an input/output processor which performs input/output processing of data between the input setting device and the processor-to-processor communications device,
  a model storage device which stores a model of the corresponding divided circuit model resulting from the data provided by the input setting device,
  a delay data storage device which stores the delay time calculated by the respective delay time processor and the passage pin table of the respective delay time processor,
  a gate expansion processor which, when an event indicating a change in an external input occurs, extracts from the model storage device a gate circuit corresponding to the event, and
  a delay time processor which calculates the delay time for the extracted gate, stores the calculated delay time and the passage pin table into the delay data storage device, and, when an event indicating a change in an external input does not occur, notifies the processor-to-processor communications device via the input/output processor.

14. A delay time analysis apparatus according to claim 11, wherein the logic device includes flip-flop circuits connected together, and the apparatus further comprising:
  an analysis section which
  checks the accumulated delay time for each path of the plurality of paths routed through the logic device after the delay time of the respective path is determined for each divided circuit model of the plurality of divided circuit models, and
  performs an over-delay and racing check between flip-flop circuits of the logic device by using the passage pin tables generated for each the path to distinguish clock path branch points and to calculate clock skew.

15. A delay time analysis apparatus according to claim 14, further comprising:
  means for performing an input timing signal check by using the passage pin tables.

16. A delay time analysis apparatus according to claim 15, wherein the analysis section determines whether respective circuits in the logic device are flip-flop circuits or memory elements, and uses the determination to calculate the clock skew.

* * * * *

UNITED STATES PATENT AND TRADEMARK OFFICE
CERTIFICATE OF CORRECTION

PATENT NO. : 5,600,568
DATED : Feb. 4, 1997
INVENTOR(S) : IWAKURA et al.

It is certified that error appears in the above-indentified patent and that said Letters Patent is hereby corrected as shown below:

Col. 2, line 49, after "by" insert --,--.

Col. 5, line 34, after "assigned to" delete "the".

Col. 9, line 28, in the equation, change "/p$^{t\cdot s}$" to --/p$^{1\cdot s}$--;
line 45 (Claim 1, line 9), change "time" to --times--.

Col. 10, line 49 (Claim 5, line 14), change "devices," to --device,--;
line 57 (Claim 5, line 22), change "events," to --event,--.

Signed and Sealed this

Twenty-fourth Day of June, 1997

Attest:

BRUCE LEHMAN

Attesting Officer

Commissioner of Patents and Trademarks